United States Patent
Lee

(10) Patent No.: US 12,406,740 B2
(45) Date of Patent: Sep. 2, 2025

(54) MEMORY CONFIGURED TO PERFORM A CHANNEL PRECHARGE OPERATION AND METHOD OF OPERATING THE MEMORY

(71) Applicant: SK hynix Inc., Icheon-si Gyeonggi-do (KR)

(72) Inventor: Hee Youl Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 153 days.

(21) Appl. No.: 18/515,975

(22) Filed: Nov. 21, 2023

(65) Prior Publication Data

US 2025/0046385 A1   Feb. 6, 2025

(30) Foreign Application Priority Data

Aug. 3, 2023   (KR) .................. 10-2023-0101597

(51) Int. Cl.
| | |
|---|---|
| G11C 16/10 | (2006.01) |
| G11C 16/04 | (2006.01) |
| G11C 16/08 | (2006.01) |
| G11C 16/34 | (2006.01) |

(52) U.S. Cl.
CPC ...... *G11C 16/3427* (2013.01); *G11C 16/0483* (2013.01); *G11C 16/08* (2013.01)

(58) Field of Classification Search
CPC ...................................................... G11C 16/10
See application file for complete search history.

(56) References Cited

U.S. PATENT DOCUMENTS

| | | | |
|---|---|---|---|
| 7,411,813 B2 | 8/2008 | Maki | |
| 2016/0247578 A1 | 8/2016 | Yun et al. | |
| 2016/0343450 A1 * | 11/2016 | Lee | G11C 16/10 |

* cited by examiner

*Primary Examiner* — Jason Lappas
(74) *Attorney, Agent, or Firm* — WILLIAM PARK & ASSOCIATES LTD.

(57) ABSTRACT

A memory includes a cell string including a first select transistor, cell transistors, and a second select transistor and a row circuit configured to drive a first select line for controlling the first select transistor, a second select line for controlling the second select transistor and word lines for controlling the cell transistors. The row circuit differently performs a discharge operation of the first select line according to a position in the cell string of a program target cell transistor.

10 Claims, 6 Drawing Sheets

MEMORY CONFIGURED TO PERFORM A CHANNEL PRECHARGE OPERATION AND METHOD OF OPERATING THE MEMORY

CROSS-REFERENCE TO RELATED APPLICATION

This application claims priority under 35 U.S.C. § 119 (a) to Korean Patent Application No. 10-2023-0101597 filed on Aug. 3, 2023, in the Korean Intellectual Property Office, which is incorporated herein by reference in its entirety.

BACKGROUND

1. Technical Field

The present disclosure generally relates to a memory, and more particularly, to a channel precharge operation of the memory.

2. Related Art

Recently, a memory capable of storing information is required in various electronic devices such as a computer and a portable communication device according to a small size, low power consumption, high performance, diversification, and the like of an electronic device. The memory may be largely classified into a volatile memory device and a non-volatile memory. The volatile memory has a high data processing speed, but has a disadvantage that power is required to be continuously supplied to maintain stored data. The non-volatile memory is not required to be continuously supplied with power to maintain stored data, but has a disadvantage that data processing speed is low.

SUMMARY

According to an embodiment of the present disclosure, a memory may include a cell string including a first select transistor, cell transistors, and a second select transistor; and a row circuit configured to drive a first select line for controlling the first select transistor, a second select line for controlling the second select transistor and word lines for controlling the cell transistors, wherein the row circuit differently performs a discharge operation of the first select line according to a position in the cell string of a program target cell transistor.

According to an embodiment of the present disclosure, a method of operating a memory including a cell string including a first select transistor, a second select transistor, cell transistors of a first group, and cell transistors of a second group located farther from the second select transistor than the first group may include determining performing of a program operation of a first select cell transistor belonging to the first group; a channel precharge step of applying activation voltages to a first select line controlling the first select transistor, a second select line controlling the second select transistor, and word lines controlling the cell transistors of the first group and the second group; a first discharge step of discharging the first select line, the second select line, and the word lines; programming the first select cell transistor; determining performing of a program operation of a second select cell transistor belonging to the second group; a channel precharge step of applying activation voltages to the first select line controlling the first select transistor, the second select line controlling the second select transistor, and the word lines controlling the cell transistors of the first group and the second group; a second discharge step of discharging the first select line, the second select line, and the word lines, and discharging the first select line more slowly than in the first discharge step; and programming the second select cell transistor.

DETAILED DESCRIPTION

Embodiments of the present disclosure may provide a technique for more efficiently performing a channel precharge operation performed during a program operation of a memory.

According to embodiments of the present disclosure, a channel precharge operation of a memory may be performed more efficiently.

Hereinafter, embodiments according to the technical spirit of the present disclosure are described with reference to the accompanying drawings. It will be understood that although the terms first, second, third etc. may be used herein to describe various elements, these elements should not be limited by these terms. These terms are only used to distinguish one element from another element, but not used to define only the element itself or to mean a particular sequence.

Figure 1:
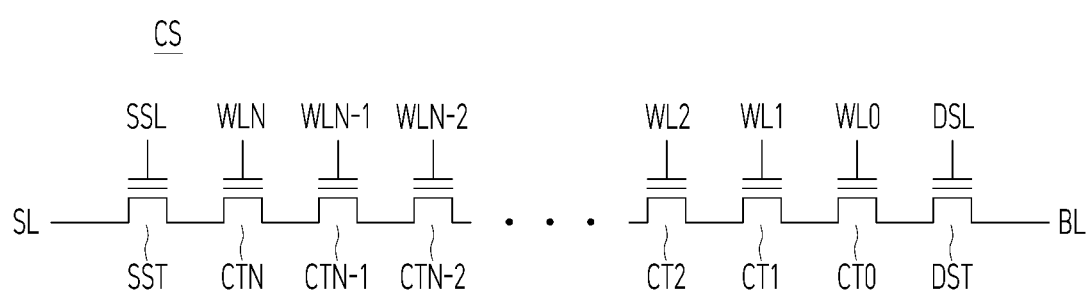
FIG. 1 is a configuration diagram of an embodiment of a cell string.

FIG. 1 is a configuration diagram of an embodiment of a cell string CS.

Referring to FIG. 1, the cell string CS may include a source select transistor SST, cell transistors CT0 to CTN (N is a natural number greater than zero), and a drain select transistor DST.

The source select transistor SST may control an electrical connection between the cell string CS and a source line SL according to control of a source select line SSL. The drain select transistor DST may control an electrical connection between the cell string CS and a bit line BL according to control of a drain select line DSL.

Gate electrodes of the cell transistors CT0 to CTN connected in series between the source select transistor SST and the drain select transistor DST may be connected to word lines WL0 to WLN. Operation voltages (program voltage, pass voltage, read voltage, and the like) required for driving may be applied to each of the word lines WL0 to WLN. Because the cell transistors CT0 to CTN are transistors for storing data, the cell transistors CT0 to CTN are also referred to as memory cells. Program of the cell transistors CT0 to CTN may be performed in an order from a cell transistor close to the drain select transistor DST to a cell transistor far from the drain select transistor DST, for example, in an order of CT0, CT1, CT2, . . . and, CTN, or may be performed in a reverse order.

When the cell transistors CT0 to CTN are programmed in the order from the cell transistor close to the drain select transistor DST to the cell transistor far from the drain select transistor DST, a channel precharge operation may be performed through the source line SL. This is because a threshold voltage of programmed cell transistors is increased, the programmed cell transistors are not turned on and may block transferal of a precharge voltage to a channel. Therefore, when the cell transistors CT0 to CTN are programmed in the reverse order, the channel precharge operation may be performed through the bit line BL. Hereinafter, for convenience of description, it is assumed that the cell transistors CT0 to CTN are programmed in the order from the cell transistor close to the drain select transistor DST to the cell transistor distant from the drain select transistor DST.

Figure 2:
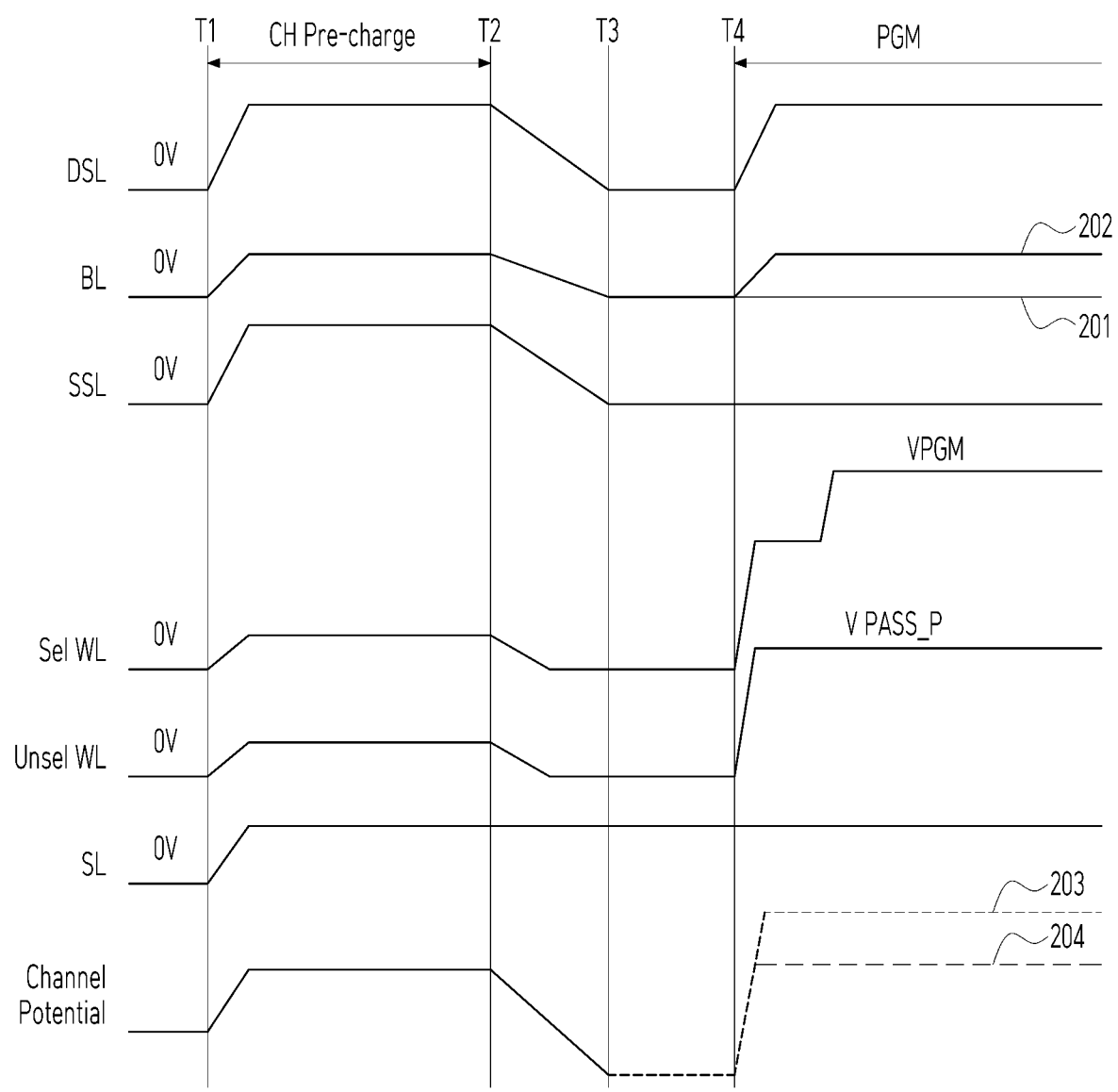
FIG. 2 is a timing diagram illustrating an example of a voltage level of lines during a program operation of the cell string of FIG. 1.

FIG. 2 is a timing diagram illustrating an example of a voltage level of lines during a program operation of the cell string CS of FIG. 1. The program operation of the cell string CS is described with reference to FIGS. 2 and 1 together.

Referring to FIG. 2, before a time T1, all of lines DSL, BL, SSL, Sel WL, Unsel WL, and SL may maintain a discharged state as 0V. Here, the selected word line Sel WL may refer to a word line corresponding to a program target cell transistor among the cell transistors CT0 to CTN, and the unselected word line Unsel WL may refer to a word line corresponding to remaining cell transistors. A channel potential may refer to a channel potential of the cell string CS.

In an embodiment, from the time T1 to a time T2 may be a channel precharge operation period CH Pre-charge, and the channel precharge operation may be an operation performed for preventing or mitigating the channel potential of cell transistors corresponding to an erase state from dropping during the program operation and maintaining the channel potential as a constant level. In an embodiment, as the channel potential of the cell transistors corresponding to the erase state is maintained as the constant level by performing the channel precharge operation, disturbance due to FN tunneling during the program operation may be prevented or mitigated. A high level of voltage may be applied to the lines DSL, BL, SSL, Sel WL, Unsel WL, and SL during the channel precharge operation period. It may be seen that a current is supplied from the source line SL to the channel by a voltage applied to the lines DSL, BL, SSL, Sel WL, Unsel WL, and SL, the channel potential is increased, and the channel is precharged.

From the time T2 to a time T3, the lines DSL, BL, SSL, Sel WL, Unsel WL, and SL may be discharged, and thus the channel precharge operation may be ended. When the voltage of the lines DSL, BL, SSL, Sel WL, Unsel WL, and SL is discharged, cell transistors programmed to have a high threshold voltage among the cell transistors CT0 to CTN may be turned off and floated. When the channel is floated, capacitive coupling may be generated between the channel and the source select line SSL, and thus the channel potential may be negatively boosted to a negative voltage level equal to or less than 0V with discharge of the source select line SSL. In order to suppress such negative boosting and consequent gate induced drain leakage (GIDL), the discharge of the source select line SSL slowly proceeds.

A period from a time T4 is a program period PGM in which the program target cell transistor is programmed, and in this period, a program voltage VPGM may be applied to the selected word line Sel WL, and a program pass voltage VPASS_P may be applied to the unselected word lines Unsesl WL. In addition, a voltage of a level for turning on the drain select transistor DST may be applied to the drain select line DSL. A low voltage 201 may be applied to the bit line BL when data to be written to the program target cell transistor is program data, and a voltage 202 higher than the low voltage 201 may be applied to the bit line BL when the data to be written to the cell transistor is erase data.

The channel potential after the time T4 shows a voltage level when the data to be written to the program target cell transistor is the erase data. It may be seen that the channel potential is boosted by the program pass voltage VPASS_P applied to the unselected word lines Unsel WL and the voltage level of the channel potential is increased. The voltage level of the channel potential may be formed differently in two cases. When the program target cell transistor is the cell transistor close to the drain select transistor DST, the channel potential may be formed relatively high (203), and the program target cell transistor is a cell transistor close to the source select transistor SST, the channel potential may be formed relatively low (204). This is because when, in an embodiment, the program target cell transistor is close to the drain select transistor DST, because many cell transistors in the erase state exist, the channel area where negative boosting occurs is narrow, so channel boosting during the program operation is relatively largely occur, and when the program target cell transistor is close to the source select transistor SST, because many cell transistors in a program state exist, the channel area where the negative boosting occurs is wide, and as a result, the channel boosting during the program operation is relatively small occur.

Figure 3:
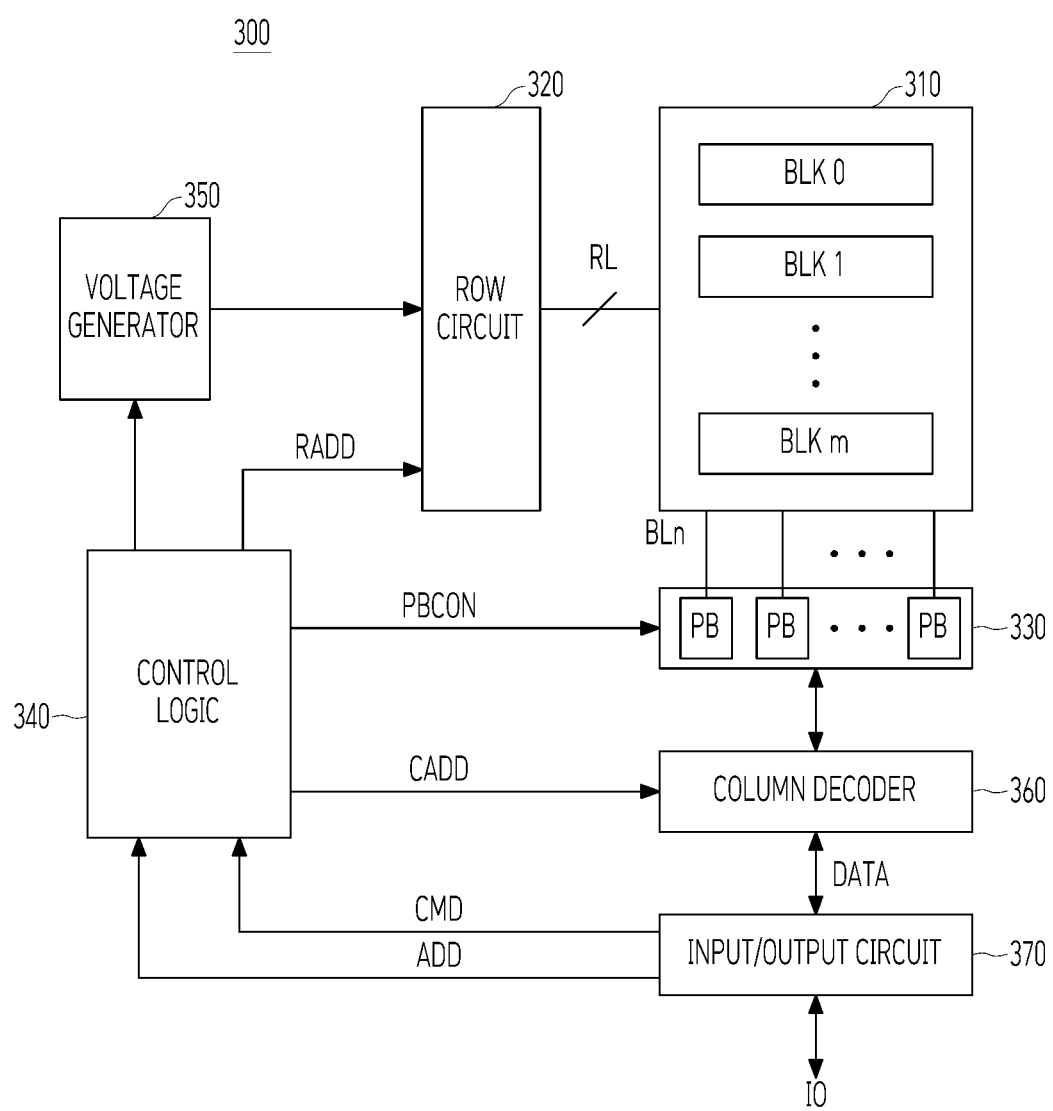
FIG. 3 is a configuration diagram of a memory according to an embodiment of the present disclosure.

FIG. 3 is a configuration diagram of a memory 300 according to an embodiment of the present disclosure.

Referring to FIG. 3, the memory 300 may include a cell array 310, a row circuit 320, a page buffer array 330, control logic 340, a voltage generator 350, a column decoder 360, and an input/output circuit (370). The control logic 340 may be implemented as hardware, software, or a combination of hardware and software. For example, the control logic 340 may be a control logic circuit operating in accordance with an algorithm and/or a processor executing control logic code.

The input/output circuit 370 may communicate with a memory controller through input/output lines IO. For example, the input/output circuit 370 may transfer a command CMD and an address ADD received through the input/output lines IO to the control logic 340, and transfer received data DATA to the column decoder 360. In addition, the input/output circuit 370 may transmit the data DATA transferred from the column decoder 360 to the memory controller through the input/output lines IO during a read operation.

The cell array 310 may include a plurality of memory blocks BLK0 to BLKm. Each of the memory blocks BLK0 to BLKn may include a plurality of cell strings CS as shown in FIG. 1. The cell strings CS of FIG. 1 of the memory blocks BLK0 to BLKn may be connected to the row circuit 320 through row lines RL and may be connected to the page buffer array 330 through bit lines BL. Here, the row lines RL may include the source select line SSL, the drain select line DSL, and word lines WL.

The row circuit 320 may decode a row address RADD transferred from the control logic 340. The row address RADD may include information for selecting one of the memory blocks BLK0 to BLKm (m is an integer equal to or greater than 1) and information for selecting one of the word lines. The row circuit 320 may select any one of the memory blocks BLK0 to BLKn. In addition, the row circuit 320 may transfer operation voltages provided from the voltage generator 350 to the row lines RL of a selected memory block. After the channel precharge operation, the row circuit 320 may differently perform a discharge operation of the row lines RL according to a position of a selected word line.

The page buffer array 330 may include page buffer circuits PB connected to the cell array 310 through the bit lines BL. The page buffer circuits PB may operate as a write driver or a sense amplifier. During the program operation, the page buffer circuits PB may operate so that the data DATA transferred through the input/output circuit 370 and the column decoder 360 is programmed into the cell array 310, and during the read operation, the page buffer circuits PB may read data stored in selected memory cells through the bit lines BL and transfer the data to the column decoder 360.

The control logic 340 may transfer the row address RADD of the address ADD received through the input/output circuit 370 to the row circuit 320 and transfer a column address CADD to the column decoder 360. The control logic 340 may control the page buffer array 330, the voltage generator 350, and the row circuit 320 to access the selected memory cells in response to the command CMD received through the input/output circuit 370. The control logic 340 may generate a page buffer control signal PBCON for controlling the page buffer array 330.

The voltage generator 350 may generate various voltages required by the memory. For example, the voltage generator 350 may be configured to generate program voltages, pass voltages, read voltages, and the like.

In response to the column address CADD transferred from the control logic 340, the column decoder 360 may transfer the data DATA to the page buffer array 330 during the program operation, and may receive the data DATA from the page buffer array 330 during the read operation.

Figure 4:
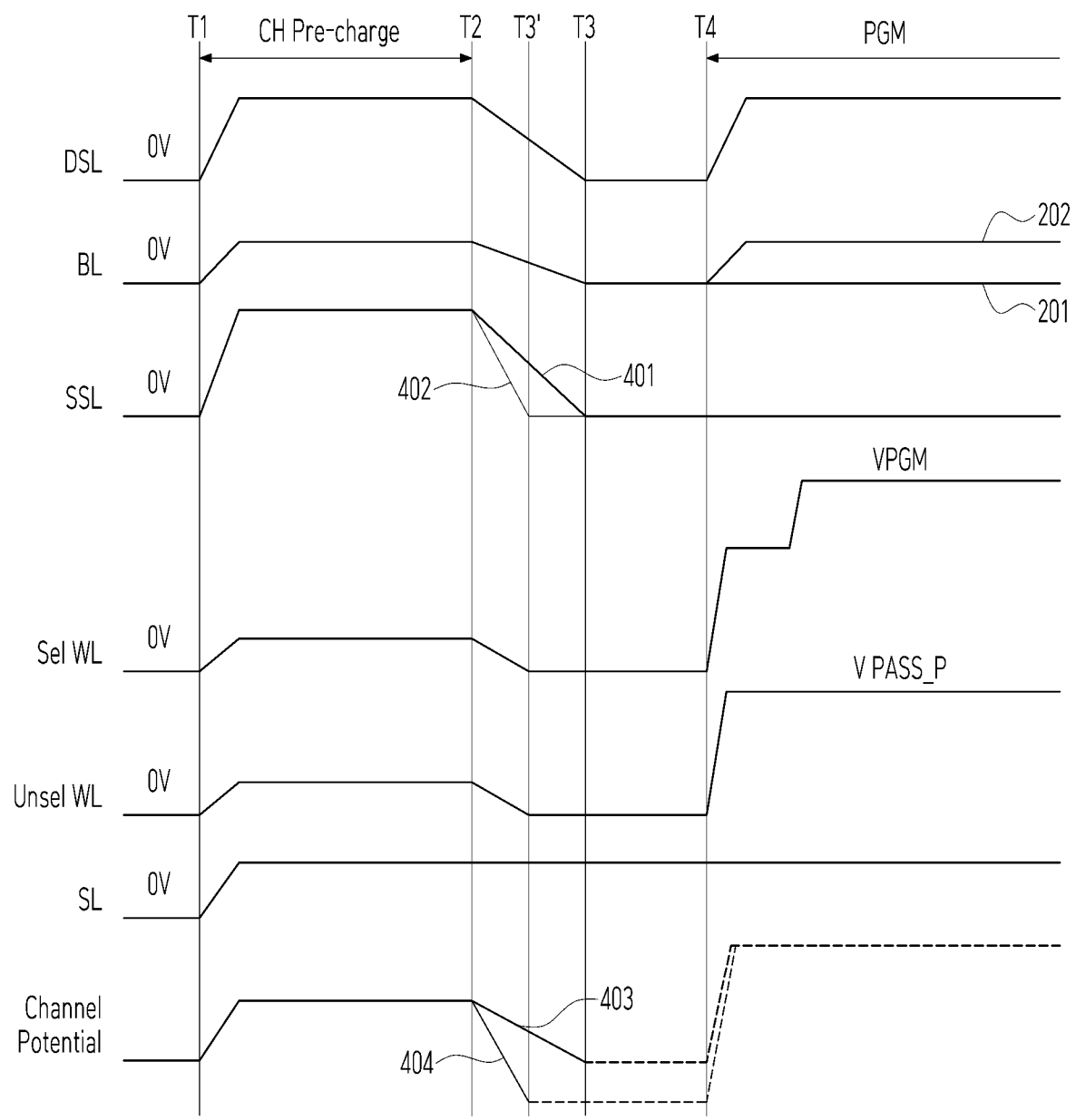
FIG. 4 is a diagram illustrating an embodiment in which a row circuit of FIG. 3 controls row lines of the cell string and a page buffer array controls a bit line during the program operation.

FIG. 4 is a diagram illustrating an embodiment in which the row circuit 320 of FIG. 3 controls the row lines RL of the cell string CS and the page buffer array 330 controls the bit line BL during the program operation.

Referring to FIG. 4, before the time T1, all of the lines DSL, BL, SSL, Sel WL, Unsel WL, and SL may maintain the discharged state as 0V.

From the time T1 to the time T2 may be the channel precharge operation period CH Pre-charge, and during a channel precharge period, high level of voltages may be applied to the lines DSL, BL, SSL, Sel WL, and Unsel WL during the channel precharge operation period. A current may be supplied from the source line SL to the channel by a voltage applied to the lines DSL, BL, SSL, Sel WL, and Unsel WL, the channel potential may be increased, and the channel may be precharged.

From the time T2 to the time T3, the lines DSL, BL, SSL, Sel WL, Unsel WL, and SL may be discharged, and thus the channel precharge operation may be ended. The row circuit 320 may differently perform the discharge operation of the source select line SSL according to a position of the selected word line Sel WL, that is, a position in the cell string of the cell transistor CT selected to perform the program operation. When the selected word line Sel WL is a word line relatively close to the source select line SSL, a discharge period of the source select line SSL may be controlled to be relatively long from the time T2 to the time T3 (401) as compared to 402. When the selected word line Sel_WL is a word line relatively far from the source select line SSL, the discharge period of the source select line SSL may be controlled to be relatively short from the time T2 to a time T3' (402) as compared to 401. When the selected word line Sel WL is the word line relatively close to the source select line SSL (401), an absolute value of a discharge slope of the source select line SSL may be relatively small, and the selected word line Sel WL is the word line relatively far from the source select line SSL (402), the absolute value of the discharge slope of the source select line SSL may be relatively large.

When the selected word line Sel WL is relatively close to the source select line SSL, because the number of cell transistors CT programmed in the cell string CS is small, because the negatively boosted area in the channel is inevitably narrow, necessity for slowly discharging the source select line SSL is low. However, when the selected word line Sel WL is relatively far from the source select line SSL, because the number of cell transistors CT programmed in the cell string CS is large, because the negatively boosted area in the channel is inevitably wide, necessity for slowly discharging the source select line SSL is high. For this reason, in an embodiment, a length of the discharge period of the source select line SSL may be differently adjusted according to a distance of the selected word line Sel WL from the source select line SSL during the discharge operation after the channel precharge.

The cell transistors CT0 to CTN of the cell string CS may be divided into two or more groups, and according to a group, whether the cell transistors CT0 to CTN are close to or far from the source select line SSL may be divided. For example, when the number of cell transistors CT0 to CT63 is 64, the cell transistors CT0 to CT63 may be divided into a group including the cell transistors CT0 to CT31 and a group including the cell transistors CT32 to CT63, the cell transistors CT0 to CT31 may be classified as the cell transistors far from the source select line SSL, and the cell transistors CT32 to CT63 may be classified as the cell transistors close to the source select line SSL. It goes without saying that the number of groups dividing the cell transistors CT0 to CTN and a position serving as criteria for classification may be changed according to design.

During the discharge period from the time T2 to the time T3, the channel potential may be negatively boosted. When the selected word line Sel WL is the word line relatively close to the source select line SSL, because the source select line SSL is slowly discharged, the channel potential may also be negatively boosted relatively small (403) as compared to 404. When the selected word line Sel WL is the word line relatively far from the source select line SSL, because the source select line SSL is quickly discharged, the time T4 potential may also be negatively boosted relatively largely (404) as compared to 403.

The period from the time T4 is the program period PGM in which the program target cell transistor is programmed, and in this period, the program voltage VPGM may be applied to the selected word line Sel WL, and a program pass voltage VPASS_P may be applied to the unselected word lines Unsesl WL. In addition, a voltage of a level for turning on the drain select transistor DST may be applied to the drain select line DSL. The low voltage 201 may be applied to the bit line BL when data to be written to the program target cell transistor is program data, and the voltage 202 higher than the low voltage 201 may be applied to the bit line BL when the data to be written to the cell transistor is erase data.

The channel potential after the time T4 shows a voltage level when the data to be written to the program target cell transistor is the erase data. It may be seen that the channel potential is boosted by the program pass voltage VPASS_P applied to the unselected word lines Unsel WL and the voltage level of the channel potential is increased. In FIG. 2, in a period after the time T4, the voltage level of the channel potential is differently formed in the two cases (203 and 204), but in FIG. 4, in an embodiment, the voltage level of the channel potential may be identically formed. This is because, in the embodiment of FIG. 4, the discharge of the source select line SSL is differently performed according to whether the selected word line Sel WL is far from or close to the source select line SSL.

In the embodiment of FIG. 4, an embodiment, in which when a position of the program target cell transistor CT is relatively close to the source select line SSL, the discharge of the source select line SSL quickly proceeds, and when the position of the program target cell transistor CT is relatively far from the source select line SSL, the discharge of the source select line SSL slowly proceeds, is described as an example. When the cell transistors CT of the cell string CS are programmed in an order from the cell transistor CT close to the source select transistor SST. When the channel precharge operation of the cell transistors CT is performed through the bit line BL, contrary to an example of FIG. 4, when the position of the program target cell transistor CT is relatively close to the source select line SSL, the discharge of the source select line SSL may slowly proceed, and when the position of the program target cell transistor CT is relatively far from the source select line SSL, the discharge of the source select line SSL may quickly proceed.

Figure 5:
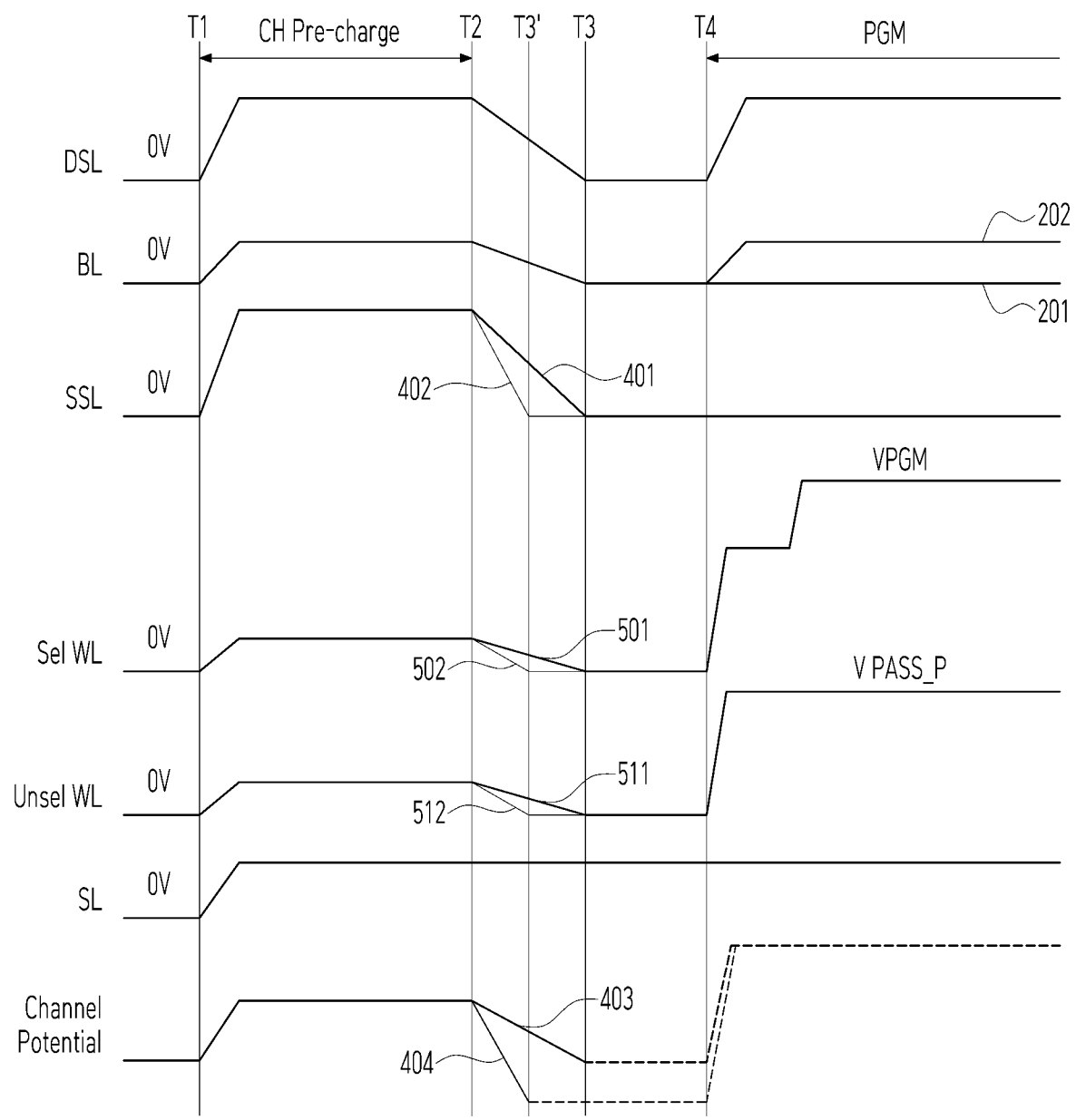
FIG. 5 is a diagram illustrating another embodiment in which the row circuit of FIG. 3 controls the row lines of the cell string and the page buffer array controls the bit line during the program operation.

FIG. 5 is a diagram illustrating another embodiment in which the row circuit 320 of FIG. 3 controls the row lines RL of the cell string CS and the page buffer array 330 controls the bit line BL during the program operation.

In FIG. 5, an embodiment in which a discharge operation of the word lines Sel WL and Unsel WL is differently performed as well as the discharge operation of the source select line SSL according to the position of the selected word line Sel WL in the discharge period T2 to T3 after the channel precharge operation period CH Pre-charge is disclosed.

Referring to FIG. 5, when the selected word line Sel WL is relatively close to the source select line SSL, the precharge of the word lines Sel WL and Unsel WL also slowly proceeds from the time T2 to the time T3 (501, 511) as compared to 502 and 512. In addition, when the selected word line Sel WL is relatively far from the source select line SSL, the precharge of the word lines Sel WL and Unsel WL may also quickly proceed from the time T2 to the time T3' (502, 512) as compared to 501 and 511.

Figure 6:
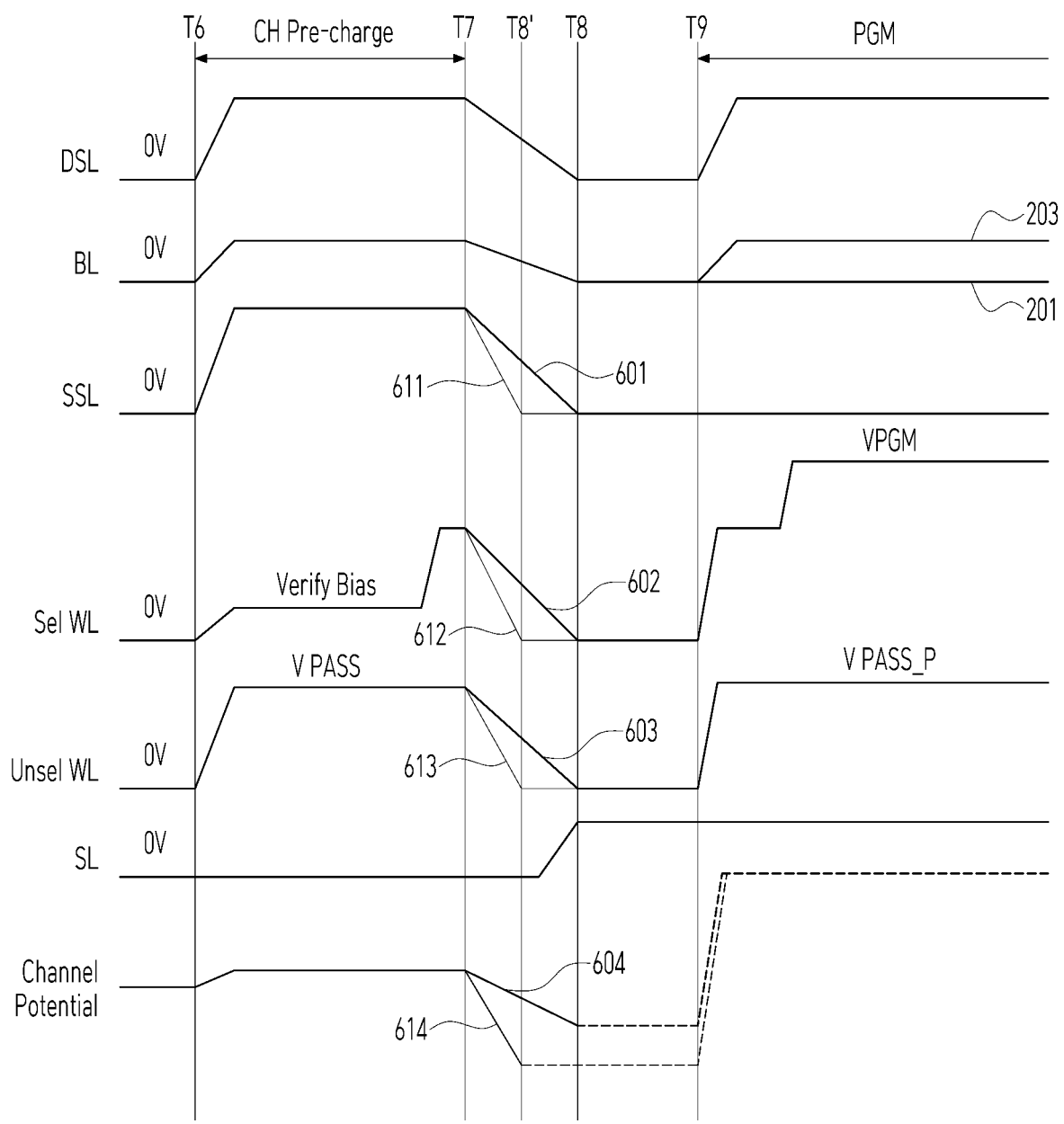
FIG. 6 is a diagram illustrating still another embodiment in which the row circuit of FIG. 3 controls the row lines of the cell string and the page buffer array controls the bit line during the program operation.

FIG. 6 is a diagram illustrating still another embodiment in which the row circuit 320 of FIG. 3 controls the row lines RL of the cell string CS and the page buffer array 330 controls the bit line BL during the program operation.

Referring to FIG. 6, before a time T6, all of the lines DSL, BL, SSL, Sel WL, Unsel WL, and SL may maintain the discharged state as 0V.

A period from the time T6 to a time T7 may be a verify operation period Verify, and a verify operation may be an operation for verifying whether or not a threshold voltage of the program target cell transistor reaches a target value during the program operation. A voltage for turning on the drain select transistor DST and the source select transistor SST may be applied to the drain select line DSL and the source select line SSL during the verify operation period Verify. In addition, a verify voltage Verify bias corresponding to a target threshold voltage of the program target cell transistor may be applied to the selected word line Sel WL. In addition, the program pass voltage VPASS_P for turning on the cell transistors may be applied to the unselected word lines Unsel WL. At an end of the verify operation period Verify, a high voltage having a level similar to that of the pass voltage VPASS may be applied to adjust a voltage level of the selected word line Sel WL to a level similar to that of the surrounding unselected word lines Unsel WL.

From the time T7 to a time T8, the lines DSL, BL, SSL, Sel WL, and Unsel WL may be discharged, and thus the verify operation may be ended. The discharge of the source select line SSL and the word lines Sel WL and Unsel WL may be quickly or slowly performed according to the position of the selected word line Sel WL. When the selected word line Sel WL is relatively close to the source select line SSL, the discharge of the source select line SSL and the word lines Sel WL and Unsel WL may be controlled relatively long from the time T7 to the time T8 (601, 602, 603) as compared to 611, 612, 613. When the selected word line Sel WL is relatively far from the source select line SSL, the discharge of the source select line SSL and the word lines Sel WL and Unsel WL may be controlled relatively short from the time T7 to a time T8' (611, 612, 613) as compared to 601, 602, 603. Similarly to the discharge operation after the channel precharge operation of FIGS. 4 and 5, the channel potential may be negatively boosted. When the selected word line Sel WL is the word line relatively close to the source select line SSL, because the source select line SSL is slowly discharged, the channel potential may also be negatively boosted relatively small (604) as compared to 614. When the selected word line Sel WL is the word line relatively far from the source select line SSL, because the source select line SSL is quickly discharged, the channel potential may also be negatively boosted relatively largely (614) as compared to 604.

A period from the time 9 T9 is the program period PGM in which the program target cell transistor is programmed, and in this period, the program voltage VPGM may be applied to the selected word line Sel WL, and the program pass voltage VPASS_P may be applied to the unselected word lines Unsesl WL. In addition, a voltage of a level for turning on the drain select transistor DST may be applied to the drain select line DSL. A low voltage 605 may be applied to the bit line BL when data to be written to the program target cell transistor is program data, and a voltage 615 higher than the low voltage 605 may be applied to the bit line BL when the data to be written to the cell transistor is erase data.

The channel potential after the time T9 shows a voltage level when the data to be written to the program target cell transistor is the erase data. It may be seen that the channel potential is boosted by the program pass voltage VPASS_P applied to the unselected word lines Unsel WL and the voltage level of the channel potential is increased.

Although embodiments according to the technical spirit of the present disclosure have been described with reference to the accompanying drawings, this is only for describing an embodiment according to the concept of the present disclosure, and the present disclosure is not limited to the above-described embodiments. Within the scope of the technical spirit of the present disclosure described in the claims, various forms of substitution, modification, and change of the embodiments will be possible by those skilled in the art to which the present disclosure belongs, and these also belong to the scope of the present disclosure.

What is claimed is:

1. A memory comprising:
a cell string including a first select transistor, a plurality of cell transistors, and a second select transistor; and
a row circuit configured to drive a first select line for controlling the first select transistor, a second select line for controlling the second select transistor and word lines for controlling the cell transistors,
wherein the row circuit differently performs a discharge operation of the first select line according to a position in the cell string of a program target cell transistor from the plurality of cell transistors.

2. The memory of claim 1,
wherein the plurality of cell transistors are sequentially programmed in an order starting from a cell transistor of the plurality of cell transistors closer to the second select transistor to a cell transistor of the plurality of cell transistors farther from the second select transistor,
wherein the plurality of cell transistors are divided into two or more groups according to a distance from the second select transistor, and
wherein the row circuit differently performs the discharge operation of the first select line according to which group of the two or more groups the program target cell transistor belongs to.

3. The memory of claim 2, wherein the row circuit adjusts a length of a discharge period of the first select line to be shorter as the program target cell transistor belongs to a group closer to the second select transistor among the groups.

4. The memory of claim 2, wherein the row circuit adjusts an absolute value of a discharge slope of the first select line as the program target cell transistor belongs to a group closer to the second select transistor among the groups.

5. The memory of claim 1, wherein the discharge operation is performed after a channel precharge operation.

6. The memory of claim 1, wherein the discharge operation is performed after a verify operation.

7. The memory of claim 1, wherein the row circuit differently performs a discharge operation of the word lines according to the position in the cell string of the program target cell transistor.

8. The memory of claim 1,
wherein the first select transistor is a source select transistor, and
wherein the second select transistor is a drain select transistor.

9. A method of operating a memory including a cell string including a first select transistor, a second select transistor, cell transistors of a first group, and cell transistors of a second group located farther from the second select transistor than the first group, the method comprising:
determining to perform a program operation of a first select cell transistor belonging to the first group;
performing a channel precharge step of applying activation voltages to:
a first select line controlling the first select transistor;
a second select line controlling the second select transistor; and
word lines controlling the cell transistors of the first group and the second group;
performing a first discharge step of discharging the first select line, the second select line, and the word lines;
programming the first select cell transistor;
determining to perform a program operation of a second select cell transistor belonging to the second group;
performing a channel precharge step of applying activation voltages to the first select line controlling the first select transistor, the second select line controlling the second select transistor, and the word lines controlling the cell transistors of the first group and the second group;
performing a second discharge step of discharging the first select line, the second select line, and the word lines, and discharging the first select line more slowly than in the first discharge step; and
programming the second select cell transistor.

10. The method of claim 9, wherein performance of the discharge of the word lines in the second discharge step is performed more slowly than the discharge of the word lines in the first discharge step.

* * * * *